(12) United States Patent
Chen et al.

(10) Patent No.: US 8,193,952 B2
(45) Date of Patent: Jun. 5, 2012

(54) METHOD AND DEVICE FOR ENCODING ELEMENTS

(75) Inventors: Ren Lei Chen, Beijing (CN); Guang Hua Zhou, Beijing (CN); Wen Juan Song, Beijing (CN); Xiao Jun Ma, Beijing (CN)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 12/737,936

(22) PCT Filed: Sep. 4, 2009

(86) PCT No.: PCT/EP2009/061479
§ 371 (c)(1),
(2), (4) Date: Mar. 2, 2011

(87) PCT Pub. No.: WO2010/026223
PCT Pub. Date: Mar. 11, 2010

(65) Prior Publication Data
US 2011/0148673 A1    Jun. 23, 2011

(30) Foreign Application Priority Data
Sep. 8, 2008    (EP) .................................... 08305534

(51) Int. Cl.
*H03M 7/00*    (2006.01)
(52) U.S. Cl. .......................................... 341/50; 341/87
(58) Field of Classification Search ................... 341/50, 341/106, 78, 87
See application file for complete search history.

(56) References Cited

U.S. PATENT DOCUMENTS
2007/0174077 A1 * 7/2007 Fu et al. ............................ 705/1
2009/0045987 A1 * 2/2009 Cho et al. ........................ 341/50

OTHER PUBLICATIONS

Ramez Alkhatib etal: "Efficient Compression and Querying of XML Repositories", Database and Expert Systems Application, 19th Int'l Conf. on IEEE, Sep. 1, 2008, pp. 365-369.
H. Liefke etal. "XMILL: An Efficient Compressor for XML Data", Sigmod Record, NY, NY, vol. 29, No. 2, Jun. 1, 2000, pp. 153-164.
Sebastian Maneth etal, "XML Tree Structure Compression", Database and Expert Systems Application, 19th Int'l Conf. on IEEE, Sep. 1, 2008, pp. 243-247.
G. Busatto etal: "Efficient memory representation of XML document trees", Information System, Pergamon Press, vol. 33, No. 4-5, Jun. 1, 2008, pp. 456-474.
Choi Byron et al: "Document Decomposition for XML Compression: A Heuristic Approach" Database Systems for Advanced Applications Lecture Notes in Computer Science, Springer, Berlin vol. 3882, Jan. 1, 2006, pp. 202-217.
Search Report Dated Oct. 9, 2009.

* cited by examiner

*Primary Examiner* — Peguy Jean Pierre
(74) *Attorney, Agent, or Firm* — Robert D. Shedd; Paul P. Kiel; Xiaoan Lu

(57) ABSTRACT

It provides a method for encoding a set of elements by using components defining the structure of each of the set of elements, wherein each element comprises data structure information and at least one data value. The method comprises the steps of: selecting a current element for encoding; determining whether the current element has the same data structure information as a previously encoded element; in the negative, encoding the data structure information of the current element and the at least one data value of the current element; and in the affirmative, encoding the at least one data value of the current element and providing an indication value associated with the current element indicating the current element has the same data structure information as said previously encoded element. The method is used to reduce the encoding redundancy of the structure information.

16 Claims, 5 Drawing Sheets

METHOD AND DEVICE FOR ENCODING ELEMENTS

This application claims the benefit, under 35 U.S.C. §365 of International Application PCT/EP2009/061479, filed Sep. 4, 2009, which was published in accordance with PCT Article 21(2) on Mar. 11, 2010 in English and which claims the benefit of European patent application No. 08305534.3, filed Sep. 8, 2008.

TECHNICAL FIELD

The present invention relates to data process, and more particularly, relates to a method and a device for encoding elements.

BACKGROUND

Presently, data is often stored and transmitted in a structured document that contains a plurality of different types of data. A structured document is a set of elements each associated with a type and at least one attribute, and interconnected by relationships that are mainly hierarchical. A typical example of the structured document is the extensible markup language (XML) document.

The structured document includes markers (also called "tags") for separating different elements. An element may itself comprise a plurality of attributes and lower-level elements, which are also called sub-elements. Thus, the structured document presents a tree or hierarchical structure, each node represents an element and is connected to a node at a higher hierarchical level representing an element that contains the elements at lower level. The nodes located at the ends of branches in such a tree structure represent elements containing data that can not be divided into information sub-elements. Herein, the data of the node located at the ends of branches is considered as the attribute value of a certain type.

There are several compression methods for encoding structured documents, of which one is the schema-based compression method. The schema for defining a structured document itself is also a structured document. A typical example of the schema is the XML schema. Generally, an XML schema is a set of schema components that define the structure of an XML instance. The schema component, which itself is also an element, is a generic term for the building blocks that comprise the data model template of the schema. In the process of compressing an instance of a structured document using a schema-based compression method, a Finite State Automaton (FSA) is derived from the definition of a schema, and then an instance of the schema or portion of such instance can be converted to a bit stream with the aid of the corresponding FSA. Some schema components may have an occurrence constraint, which is defined by the attributes of minOccurs and maxOccurs. This kind of schema components is usually called occurrence node.

Below is an example of an XML schema containing an occurrence node with maxOccurs attribute set to 100.

```
<?xml version="1.0" encoding="ISO-8859-1"?>
<schema targetNamespace="urn:thomson:SchemaExample"
xmlns="http://www.w3.org/2001/XMLSchema"
xmlns:s="urn:thomson:SchemaExample"
xmlns:xs="http://www.w3.org/2001/XMLSchema"
xmlns:xsi="http://www.w3.org/2001/XMLSchema-instance" >
    <element name="testSchema">
        <complexType>
            <choice maxOccurs="100">
                <element name="e1" type="xs:string"/>
                <element name="e2" type="xs:string"/>
```

-continued

```
                <element name="e3" type="xs:string"/>
                <element name="e4" type="xs:string"/>
                <element name="e5" type="xs:string"/>
            </choice>
        </complexType>
    </element>
</schema>
```

Below is an example of an instance according to the above XML schema.

```
<?xml version="1.0" encoding="ISO-8859-1" ?>
<s:testSchema xmlns:s="urn:thomson:SchemaExample"
xmlns:b="urn:thomson:SchemaB"
xmlns:a="urn:thomson:SchemaA"
xmlns:c="urn:thomson:SchemaC"
xmlns:xsi="http://www.w3.org/2001/XMLSchema-instance"
xsi:schemaLocation="urn:thomson:SchemaExample ./SchemaEx-
ample.xsd">
    <e1>AAAA</e1>
    <e1>BBBB</e1>
    <e1>CCCC</e1>
    <e1>DDDD</e1>
    <e1>EEEE</e1>
</s:testSchema>
```

It can be seen that element e1 repeats 5 times with different data values in this XML instance. The conventional schema-based compression method generates 5 times the same structure information of element e1 in the resulting encoded bit stream, which is deemed redundant.

SUMMARY

According to an aspect of the present invention, it provides a method for encoding a set of elements wherein each element comprises a data structure of a type and at least one attribute value. The method comprises the steps of: selecting a current element for encoding; determining whether the current element has the same structure type as a previously encoded element; in the negative, encoding the data structure of the current element and the at least one attribute value of the current element; and in the affirmative, encoding the at least one attribute value of the current element and providing an indication value indicating the current element has the same data structure type as the previously encoded element.

According to an aspect of the present invention, it provides a method for decoding encoded data of a set of elements wherein each element comprises a data structure of a type and at least one attribute value. The method comprises the steps of: selecting the encoded data of a current element for decoding; and if determining said current element has same structure type as the previously decoded element based on a portion of the encoded data indicating the current element has the same data structure type as the previous decoded element, deriving the at least one attribute value by decoding said encoded data and deriving the data structure of said current element by using the data structure of said previous decoded element.

According to an aspect of the present invention, it provides a data structure for carrying the encoded data of a current element, wherein the current element has a data structure of a type and at least one attribute value. The data structure comprises an attribute value field used to carry the encoded data of the at least one attribute value; and an indication field used to indicate whether the current element has the same data structure type as a previously encoded element.

According to an aspect of the present invention, it provides an encoder for encoding a set of elements wherein each element comprises a data structure of a type and at least one attribute value. The encoder comprises:

an input module (402) configured to receive data; and a process module (403) configured to determine whether the current element has the same structure type as a previously encoded element, encode the data structure of the current element and the at least one attribute value in response to the negation of said determination, and encode the at least one attribute value of the current element and provide an indication value indicating the current element has the same data structure type as the previously encoded element in response to the affirmation of said determination.

According to an aspect of the present invention, it provides a decoder for decoding encoded data of a set of elements wherein each element comprises a data structure of a type and at least one attribute value. The decoder comprises: an input module (502) configured to receive the encode data of a current element for decoding; and a process module (503) configured to determine whether said current element has same structure type as the previously decoded element based on a portion of the encoded data, wherein the portion of the encoded d indicates the current element has the same data structure type as the previous decoded element, and responsive to the affirmation of the determination derive the at least one attribute value by decoding said encoded data and derive the data structure of said current element by using the data structure of said previous decoded element.

According to an aspect of the present invention, it reduces the encoding redundancy of the structure information.

It is to be understood that other aspects and advantages of the present invention will be found after reading the following detailed description of the present invention.

BRIEF DESCRIPTION OF THE DRAWINGS

The below description explains an embodiment of the invention with the help of the accompanying drawings, which are included to provide a further understanding of the invention and are incorporated in and constitute a part of this application. The invention is not limited to the embodiment.

In the drawings.

DETAILED DESCRIPTION

Figure 1:
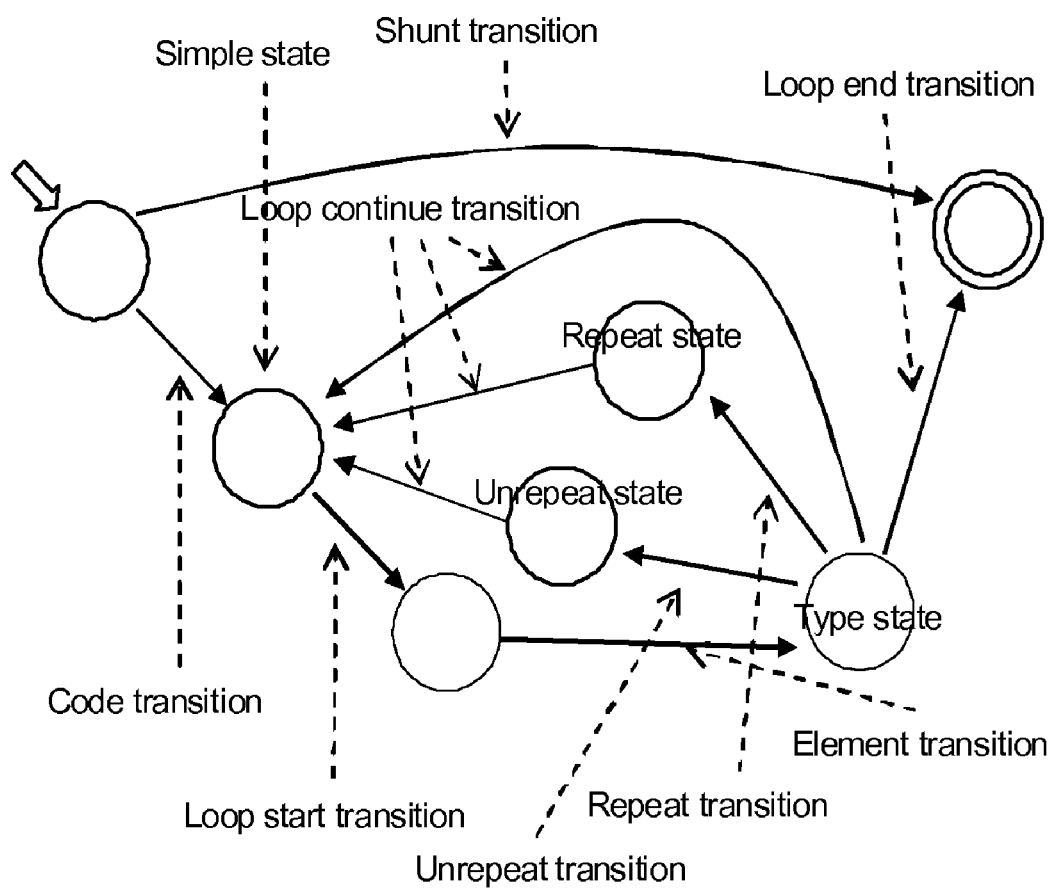
FIG. 1 is a diagram illustrating the state transition for the occurrence node according to an embodiment of the present invention.

The embodiment of the present invention will now be described in detail in conjunction with the drawings. In the following description, some detailed descriptions of known functions and configurations may be omitted for clarity and conciseness.

The embodiment is elaborated in a data processing environment employing a schema-based compression method. As an example, the document ISO/IEC 15938-1:2002/Amd 2: 2006 Information Technology-Multimedia Content Description Interface-Part1, Systems, available in ISO website, defines certain aspects of a schema-based compression environment. The embodiment described below is placed in a framework of such environment along with the changes indicated in the description. However, the invention should not be limited to the described embodiment.

In the schema-based compression method, an FSA is used to encode the structure information of elements. Herein, the structure information of an instance includes information about components of the element except the data value contained in the element in an instance of a structured document, for example, sequence, choice, properties and other structures which compose the element. As can be seen from FIG. 1 the state transition diagram for the occurrence node according to the embodiment of the present invention, the FSA uses the Shunt transition and Loop transition (Loop start transition, Loop end transition and Loop continue transition) to encode one or more elements or groups of elements. Furthermore, states of "Repeat state" and "Unrepeat state" are added in order to reduce the redundant structure information.

Since the embodiment is placed in the framework stipulated by ISO/IEC 15938-1:2002/Amd 2: 2006 Information Technology-Multimedia Content Description Interface-Part1 along with some changes, the below gives a brief introduction about states and transitions:

Element transition: when crossed, it specifies to the decoder which element is present.

Type state: when activated, it triggers type decoders.

Loop transition: it is used to model the decoding of one or more elements or groups of elements. In the embodiment, "Loop transition" comprises the "loop start transition", the "loop end transition", the "loop continue transition", the "Repeat transition" and the "Unrepeat transition".

Loop start transition: it is crossed when there are many occurrences of some elements or groups of elements to be decoded.

Loop continue transition: it is crossed when there is at least one more element or group of elements to be decoded.

Loop end transition: it is crossed when there are no more elements or groups of elements to be decoded.

Code transition: it is associated with a binary code and a signature. Code transition is crossed when its associated binary code is read from the binary description stream. The binary code is deduced from its signature.

Shunt transition: it is a special kind of code transition. Its binary code value is always equal to 0.

Simple state: it has no specific behavior and is used to structure the automaton.

Repeat state: it is crossed when the element has the same structure information as the previous element.

Unrepeat state: it is crossed when the element has different structure information compared to the previous element.

When an XML file or a fragment thereof is compressed, each element is parsed one by one, and recursively for the nested elements. As to the process for an occurrence element, it loops in the FSA as shown in FIG. 1, and the codes of passed transitions form the encoded result. The example of the XML instance in the background shows that element e1 occurs 5 times with different data values. Firstly, it crosses code transition, loop transition and element transition to type state. Since it is the first time that element e1 has occurred, it crosses loop continue transition to simple state directly. Secondly, when it reaches the type state second time in the course of encoding the second element e1, it determines whether the structure information of the second element e1 is the same as that of the previous encoded element. If they are the same and the next element is also e1, then it will cross the repeat state to the simple state. Or otherwise, if they are not same, it will cross the unrepeat state. The procedure is iterated until all elements are parsed. And at last, it will cross the loop end transition to the end state.

Figure 2:
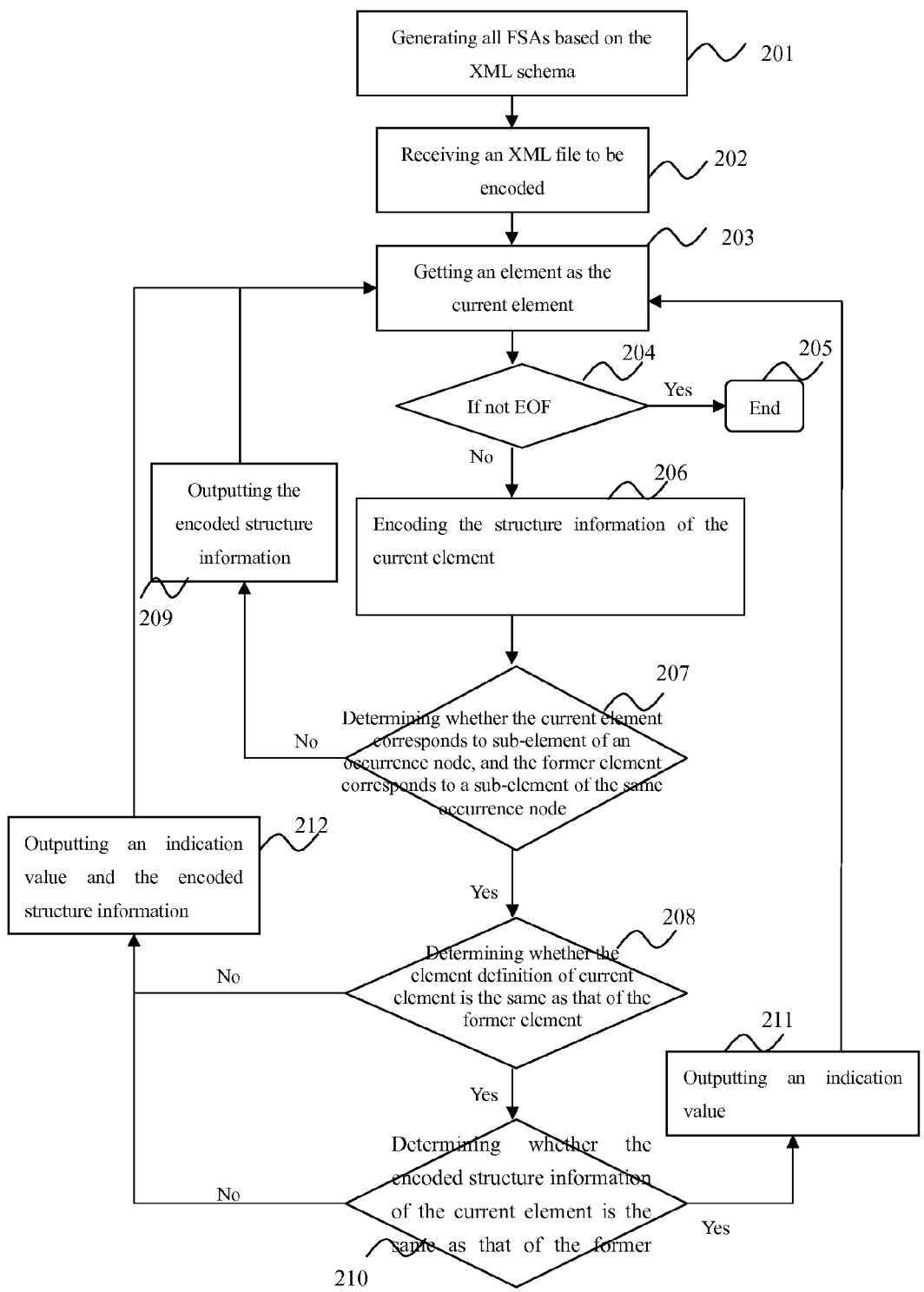
FIG. 2 is a flow chart illustrating the encoding method carried out by the encoder device according to the embodiment of the present invention.

The encoder device compresses the XML instance by encoding it with the aid of the corresponding XML schema. FIG. 2 is a flow chart illustrating the encoding method with the aid of the XML schema carried out by the encoder device according to the embodiment:

In step 201, the encoder device generates all FSAs, which are used to encode elements in an XML file, based on the XML schema.

In step 202, the encoder device receives an XML file associated with the XML schema to be encoded.

In step 203, the encoder device gets an element from the XML file as current element.

In step 204, the encoder device determines whether the current element is EOF (end of file). If it is EOF, then the encoder device will end the encoding process in step 205. Or otherwise, if not, it will go to step 206.

In step 206, the encoder device encodes the structure information of the current element by using the corresponding FSA to generate encoded structure information. Herein, the encoded structure information is typically in binary format. Furthermore, the data value contained in the current element can be encoded at this step or at a later step after outputting the final encoded structure information to generate an encoded data value. And the combination of the encoded structure information and the encoded data value forms the resulting encoded element. In order to reduce the redundancy of structure information encoding, the following steps will mainly be focused on the aspect of encoding the structure information.

In step 207, the encoder device determines whether the current element corresponds to a sub-element of the occurrence node and the previous element corresponds to a sub-element of the same occurrence node. If not, it will go to the step 209, or if yes, it will go to the step 208. Due to the method is intended to reduce the redundancy during the encoding of the occurrence node, this step is intended to determine whether the current element belongs to the same occurrence node. Therefore, it can save the following determination steps in case the current element and the previous element do not belong to the same occurrence node.

In step 209, the encoder device outputs the encoded structure information of the current element.

In step 208, the encoder device determines whether the element definition information of the current element is the same as that of the previous element. If not, it will go to the step 212, or if yes, it will go to the step 210. This step is used to distinguish the elements being different sub-element of the same occurrence node. Sometimes, this step is necessary because different structure information of different elements may have the same encoded structure information. Herein, the element definition information is the information used to define the detail structure of the element in the schema. It can be seen from the previous example of the XML schema that element definitions of element e1 and element e2 in the XML schema are not the same. The information relating to the previous element, such as element definition information, FSA and the encoded structure information, is stored in a temporary or volatile storage device, such as RAM, when the encoder device performs the step 206 to the previous element. And the storage device is updated after the current element is encoded.

In step 212, the encoder outputs an indication value indicating the difference, such as bit "0", and the encoded structure information of the current element.

In step 210, the encoder device determines whether the encoded structure information of the current element is the same as that of the previous element in the XML file by comparing the encoded structure information of the current element generated in the step 206 to the encoded structure information of the previous element. If yes, it will go to the step 211, or if not, it will go to the step 212.

In step 211, the encoder outputs an indication value indicating the sameness, such as bit "1". To some extent, the indication value can also be recognized as a flag to indicate the presence of the encoded structure information.

According to an aspect of the present invention, a man skilled in the art will understand that the step 207 is intended to determine whether the current element and the previous element belong to the same occurrence node, and the steps 208 and 210 are jointly used to determine whether the structure information of the current element in the XML file is the same as the previous one because different elements with different structure information may have the same encoded structure information in binary format. Furthermore, it is apparent to one skilled in the art that other means are possible to determine the sameness of the structure information between the current element and the previous element when applying the method to other environment where the instance of a structured document is encoded with the aid the schema. Through using the flag indicative of the presence of the encoded structure information, it reduces the size of encoded elements having the same structure information so as to save the storage size and the bandwidth when transmitting the XML file containing such elements.

According to a variant of the present embodiment, the encoder device does not generate all FSAs in step 201. Instead, the encoder device merely generates the necessary corresponding FSA for an element before encoding the element, or the FSAs are pre-stored in the device instead of being generated.

According to a variant of the present embodiment, the step 206 is not necessarily performed before the step 207. If other methods or means are used to perform the determination of step 210 without the use of the encoded structure information. But the structure information of the element should be encoded before it is outputted.

According to a variant of the present embodiment, the method can be applied on a fragment of an XML file instead of the whole XML file.

Figure 3:
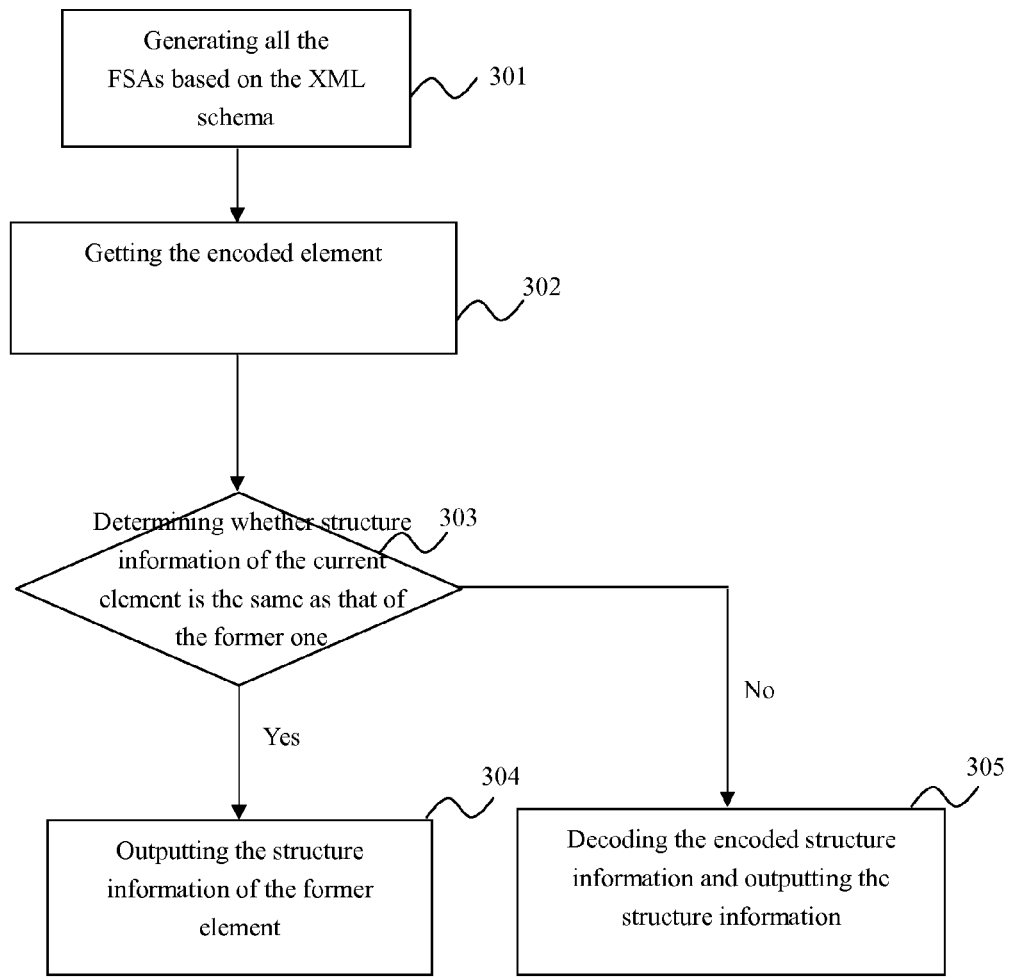
FIG. 3 is a flow chart illustrating the decoding method carried out by the decoder device according to the embodiment of the present invention.

FIG. 3 is a flow char illustrating the decoding method carried out by the decoder device according to the present embodiment of the invention.

In step 301, the decoder device generates all the FSAs for decoding the encoded elements based on the corresponding XML schema.

In step 302, the decoder device gets the current encoded element belonging to the occurrence node.

In step 303, the decoder device determines whether the structure information of the current element is the same as that of the previous element based on the indication value contained in the encoded element. If the same, it will go to step 304, or if not it will go to step 305. As an example, the indication value of bit "1" indicates the structure information of the current element is the same as that of the previous one, and the bit "0" indicates they are different. In other words, the indication value can be considered as a flag used to indicate whether the encoded structure information is present or not. Herein, information relating to the previous element is temporarily stored in a buffer or a storage device when the decoder device decodes the previous element, and the content of the buffer or storage device is updated after the decoder device decodes the current element.

In step 304, the decoder device outputs the stored structure information of the previous element.

In step 305, the decoder device decodes the encoded structure information based on the corresponding FSA to generate the structure information of the current element and outputs the structure information of the current element.

Furthermore, the decoding process of the encoded data value can be done in the course of decoding the encoded structure information or after the encoded structure information is decoded.

According to the embodiment of the present invention, there is provided a data structure for carrying encoded element of occurrence node type in a schema-based compression environment. The data structure comprises an indication field, and further may comprise a structure information field and a content field for conveying the encoded structure information and the encoded data value of the element separately. The indication field is used to indicate whether the structure information of the element is the same as that of the previous element. If the structure information of the element is the same as that of the previous one, the indication field is set a value indicating the sameness and the structure information field is not present, or otherwise, the indication field is set a value indicating the difference and the structure information field is present. Therefore, the indication field can also be used to indicate whether the structure information field is present or not.

Figure 4:
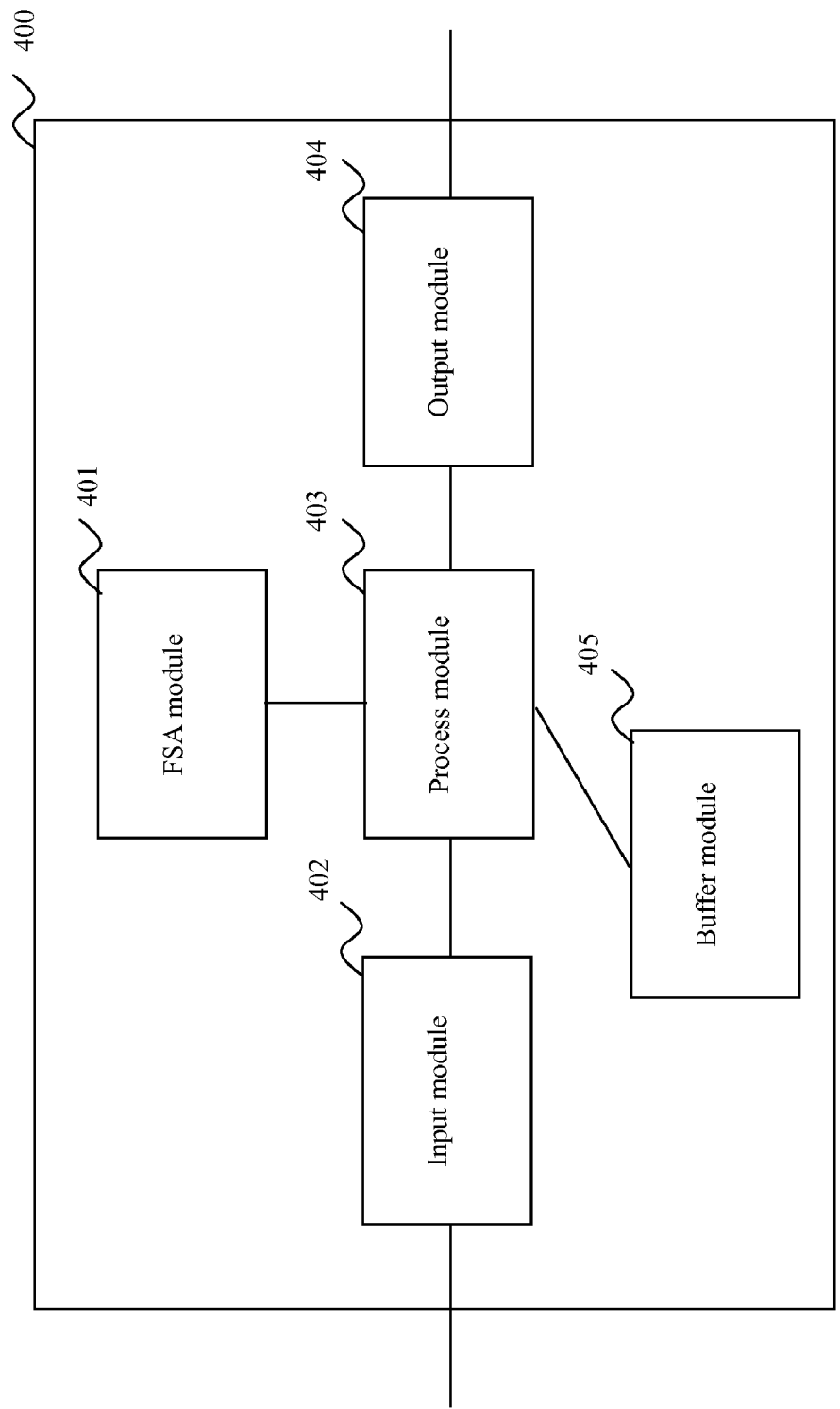
FIG. 4 is a block diagram illustrating the encoder device according to the embodiment of the present invention.

FIG. 4 is a block diagram illustrating the encoder device according to the present embodiment of the invention. The encoder device 400 comprises an FSA module 401, an input module 402, a process module 403, an output module 404 and a buffer module 405. The FSA module 401 is configured to provide FSA based on an XML schema for the process module 403. The FSA can be provided in a way that the FSA module 401 generates the FSA upon the process module's request for the FSA, or the FSA module 401 firstly generates all FSAs based on the XML schema, stores all the FSAs in a storage device, and then returns the FSA to the process module 403 responsive to the request for the FSA. The input module 402 is configured to receive data. The output module 404 is configured to output data. The buffer module 405 is configured to buffer data. The process module 403 is configured to receive an element to be encoded from the input module 402 as the current element, and determines whether the structure information of the current element is the same as that of the previous element based on the structure information of the previous element provided by the buffer module 405. If the same, the process module 403 will use the output module 404 to output an indication value indicating the absence of the encoded structure information. If not, the process module 403 will use the output module 404 to output an indication value indicating the presence of the encoded structure information, and the process module is further configured to encode the structure information of the current element to generate the encoded structure information of the current element based on the corresponding FSA received from the FSA module 401. Herein, information relating to the previous element, such as encoded structure information of the previous element, is stored in the buffer module 405 when the process module 403 encodes the previous element, and the information stored in the buffer module 405 is updated after the current element is encoded.

Figure 5:
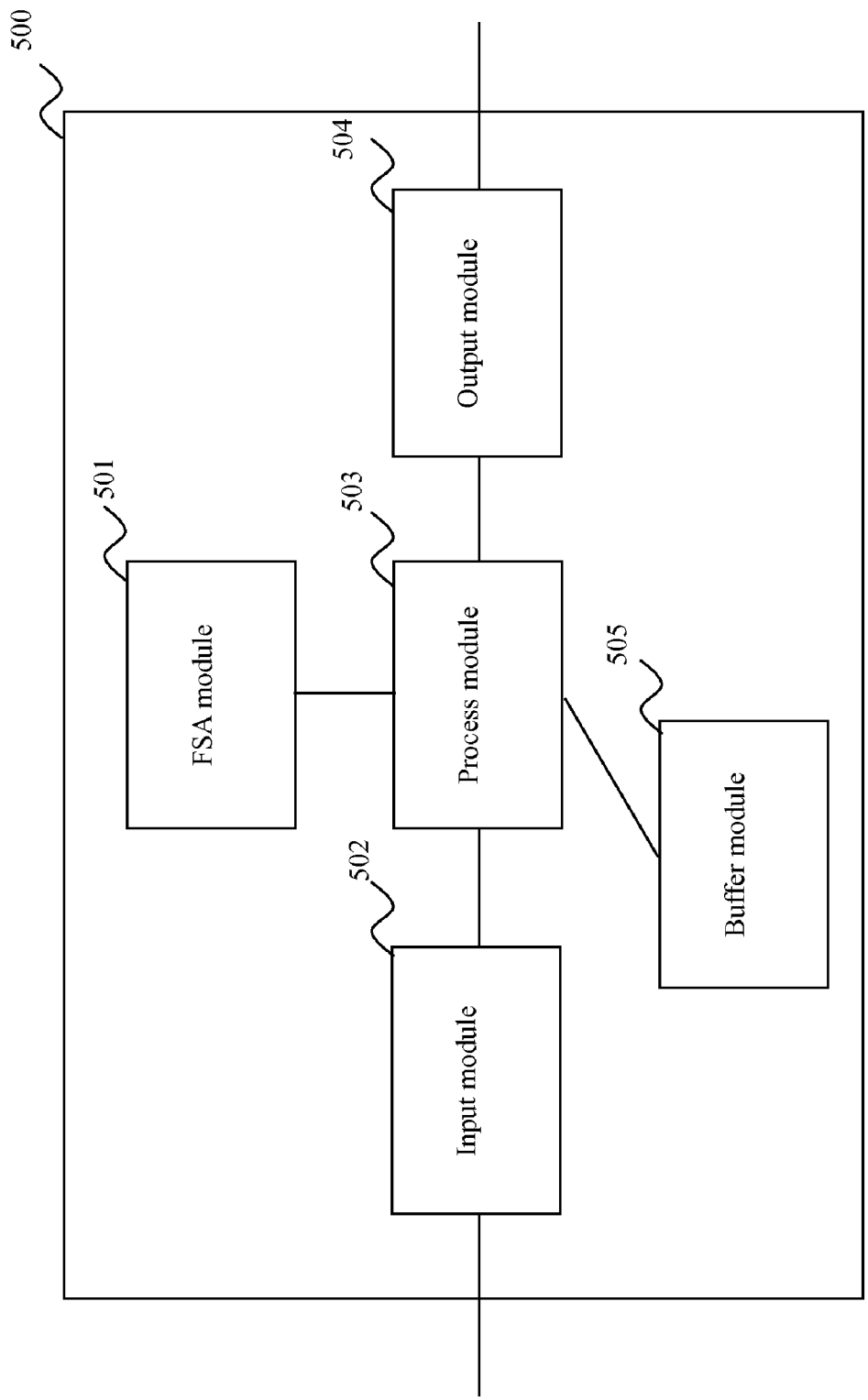
FIG. 5 is a block diagram illustrating the decoder device according to the embodiment of the present invention.

FIG. 5 is a block diagram illustrating the decoder device according to the present embodiment of the invention. The decoder device 500 comprises an FSA module 501, an input module 502, a process module 503, an output module 504 and a buffer module 505. The FSA module 501 is configured to provide FSA for the process module 503 based on an XML schema. The input module 502 is configured to receive data. The output module 404 is configured to output data. The buffer module 505 is configured to buffer data. The process module 503 of the decoder device 500 is configured to generate the structure information of the element based on the data received from the input module 502 by using the corresponding FSA derived from the FSA module 501. To be specific, the decoder device 500 receives the encoded element from the input module 502 as the current encoded element, and determines whether the structure information of the current element is the same as that of the previous element based on the indication value contained in the encoded element. If they are the same, the process module 503 will use the output module 504 to output the structure information of the previous element, which is stored in the buffer module 505 when decoding the encoded structure information of the previous element. Or otherwise, if not the same, the process module 503 will decode encoded structure information of the current element based on the corresponding FSA received from the FSA module 501, and uses the output module 504 to output the structure information of the current element. Herein, information relating to the previous element, such as the structure information of the previous element, is stored in the buffer module 505 when the process module 503 decodes the previous element, and the information stored in the buffer module 505 is updated after the current encoded element is decoded.

Below is experimental data along with annotations. Regarding the example of schema and XML instance thereof, the output under the framework stipulated by ISO/IEC 15938-1:2002/Amd 2: 2006 Information Technology—Multimedia Content Description Interface-Part1 is shown below.

0000 0100 #number of element
000 #position code
0 #typecast flag
0 0100 #size of the string
0100 0001 0100 0001 0100 0001 0100 0001 #value of the string
000 #position code
0 #typecast flag
0 0100
0100 0010 0100 0010 0100 0010 0100 0010 #value of the string
000 #position code
0 #typecast flag
0 0100 #size of the string
0100 0011 0100 0011 0100 0011 0100 0011 #value of the string
000 #position code
0 #typecast flag
0 0100 #size of the string
0100 0100 0100 0100 0100 0100 0100 0100 #value of the string
000 #position code 0 #typecast flag
0 0100 #size of the string
0100 0101 0100 0101 0100 0101 0100 0101 #value of the string
000

The output in accordance to the embodiment of the invention is shown below:
0000 0100 #number of element
000 #position code
0 #typecast flag
0 0100 #size of the string
0100 0001 0100 0001 0100 0001 0100 0001 #value of the string
1 #repeat flag
0 0100 #size of the string
0100 0010 0100 0010 0100 0010 0100 0010 #value of the string
1 #repeat flag
0 0100 #size of the string
0100 0011 0100 0011 0100 0011 0100 0011 #value of the string
1 #repeat flag
0 0100 #size of the string
0100 0100 0100 0100 0100 0100 0100 0100 #value of the string
1 #repeat flag
0 0100 #size of the string
0100 0101 0100 0101 0100 0101 0100 0101 #value of the string
000

It can be seen from the above experimental data that the redundant structure information is reduced.

A number of embodiments have been described. Nevertheless, it will be understood that various modifications may be made. For example, elements of different embodiments may be combined, supplemented, modified, or removed to produce other embodiments. Additionally, one of ordinary skill will understand that other structures and processes may be substituted for those disclosed and the resulting embodiments will perform at least substantially the same function(s), in at least substantially the same way(s), to achieve at least substantially the same result(s) as the embodiments disclosed.

The invention claimed is:

1. A method for encoding a set of elements by using components defining the structure of each of the set of elements, wherein each element comprises data structure information and at least one data value, wherein the method comprises the steps of:
   selecting a current element for encoding;
   determining whether the current element has the same data structure information as a previously encoded element;
   in the negative, encoding the data structure information of the current element and the at least one data value of the current element; and
   in the affirmative, encoding the at least one data value of the current element and providing an indication value associated with the current element indicating the current element has the same data structure information as said previously encoded element.

2. The method according to claim 1, wherein, before determining whether the current element has the same data structure information as said previously encoded element, it further comprises
   determining whether the current element and said previously encoded element correspond to the same components among the set of components;
   in the negative, encoding the data structure information of the current element and the at least one data value of the current element; and
   in the affirmative, going to the step of determining if they have the same data structure information.

3. The method according to claim 1, wherein, the step of determining whether the current element has the same data structure information as said previously encoded element further comprises
   determining whether the encoded structure information of the current element is the same as that of said previously encoded element.

4. The method according to the claim 3, wherein, before determining whether the encoded structure information of the current element is the same as that of said previously encoded element, the method further comprises:
   determining whether the element definition information of the current element is the same as that of said previously encoded element by using the set of components; and
   in the negative, encoding the data structure information of the current element and the at least one data value of the current element; and
   in the affirmative, going to the step of determining whether the encoded structure information of the current element is the same as that of said previously encoded element.

5. The method according to the claim 1, wherein, the step of encoding the data structure information of the current element further comprises:
   deriving an encoding tool corresponding to said current element from said set of components for encoding the data structure information of said current element; and
   encoding the data structure information of said current element based on said encoding tool.

6. The method according to claim 1, wherein, said set of elements are received from a file or a fragment associated with said set of components.

7. A method for decoding encoded data of a set of elements by using components defining the structure of each of the set of elements, wherein each element comprises data structure information and at least one data value, wherein, the method comprises the steps of:
   selecting the encoded data of a current element for decoding; and
   if determining said current element has the same data structure information as a previously decoded element based on a portion of the encoded data of the current element indicating the current element has the same data structure information as said previously decoded element, deriving the at least one data value by decoding said encoded data and deriving the data structure information of said current element by using the data structure information of said previous decoded element.

8. The method according to the claim 7, wherein, it further comprises:
   if determining said current element has a different data structure information compared to said previously decoded element, deriving the at least one data value and the data structure information by decoding said encoded data of said current element.

9. A data structure for carrying the encoded data of a current element that has been encoded by using components defining the structure of the current element, wherein the current element has data structure information and at least one data value, wherein, the data structure comprises:
   a data value field used to carry the encoded data of the at least one data value of the current element; and an indication field used to indicate whether the current element has the same data structure information as a previously encoded element.

10. An encoder for encoding a set of elements by using components defining the structure of each of the set of elements, wherein each element comprises data structure information and at least one data value, wherein, the encoder comprises:
- an input module configured to receive data; and
- a process module configured to determine whether a current element to be encoded has the same data structure information as a previously encoded element, encode the data structure information of the current element and the at least one data value in response to the negation of said determination, and in response to the affirmation of said determination, encode the at least one data value of the current element and provide an indication value indicating the current element has the same data structure information as said previously encoded element.

11. The encoder according to the claim 10, wherein, the current element and said previously encoded element correspond to the same component among the set of components and the process module employs the set of components to encode the data structure information.

12. The encoder according to the claim 11, wherein, the encoder further comprises:
- an encoding tool module configured to provide a tool for encoding the data structure information of an element by deriving from the set of components; and the encoding of the data structure information further comprises:
- said process module is further configured to encode the data structure information of said current element based on the corresponding tool of said current element provided by said encoding tool module.

13. A decoder for decoding encoded data of a set of elements by using components defining the structure of each of the set of elements, wherein each element comprises data structure information and at least one data value, wherein, the decoder comprises:
- an input module configured to receive the encoded data of a current element for decoding; and
- a process module configured to determine whether said current element has the same structure information as a previously decoded element based on a portion of the encode data of the current element indicating the current element has the same data structure information as the previously decoded element, and responsive to the affirmation of the determination derive the at least one data value by decoding said encoded data and derive the data structure information of said current element by using the data structure information of said previous decoded element.

14. The decoder according to the claim 13, wherein, in response to the negation of said determination, the said process module is further configured to derive the at least one data value and the data structure information of said current element by decoding said encoded data of said current element.

15. A storage medium for encoding a set of elements by using components defining the structure of each of the set of elements, wherein each element comprises data structure information and at least one data value, wherein, the storage medium comprises instructions for:
- selecting a current element for encoding;
- determining whether the current element has the same data structure information as a previously encoded element;
- in the negative, encoding the data structure information of the current element and the at least one data value of the current element; and
- in the affirmative, encoding the at least one data value of the current element and providing an indication value indicating the current element has the same data structure information as said previously encoded element.

16. A storage medium for decoding encoded data of a set of elements by using components defining the structure of each of the set of elements, wherein each element comprises data structure information and at least one data value, wherein, the storage medium comprises instructions for:
- selecting the encoded data of a current element for decoding; and
- if determining said current element has the same data structure information as a previously decoded element based on a portion of the encoded data of the current element indicating the current element has the same data structure information as the previously decoded element, deriving the at least one data value by decoding said encoded data and deriving the data structure information of said current element by using the data structure information of said previous decoded element.

* * * * *